United States Patent
Hsieh et al.

(10) Patent No.: US 8,980,711 B2
(45) Date of Patent: Mar. 17, 2015

(54) MEMORY DEVICE STRUCTURE AND METHOD

(75) Inventors: Ping-Pang Hsieh, Tainan (TW); Kun-Tsang Chuang, Miaoli (TW); Chia Hsing Huang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/484,097

(22) Filed: May 30, 2012

(65) Prior Publication Data

US 2013/0224943 A1 Aug. 29, 2013

Related U.S. Application Data

(60) Provisional application No. 61/604,438, filed on Feb. 28, 2012.

(51) Int. Cl.
*H01L 21/336* (2006.01)
*H01L 21/28* (2006.01)
*H01L 29/423* (2006.01)

(52) U.S. Cl.
CPC ..... *H01L 21/28273* (2013.01); *H01L 21/28282* (2013.01); *H01L 29/42324* (2013.01)
USPC ............................. 438/264; 438/263; 438/594

(58) Field of Classification Search
CPC ..................... H01L 21/28273; H01L 21/28282
USPC ........................................ 438/594, 263, 264
See application file for complete search history.

(56) References Cited

U.S. PATENT DOCUMENTS

| | | | | |
|---|---|---|---|---|
| 6,297,095 | B1 * | 10/2001 | Muralidhar et al. | 438/257 |
| 2002/0155698 | A1 * | 10/2002 | Iyer et al. | 438/636 |
| 2009/0032863 | A1 * | 2/2009 | Levy et al. | 257/324 |
| 2009/0090952 | A1 * | 4/2009 | Olsen et al. | 257/314 |
| 2009/0181531 | A1 * | 7/2009 | Chae et al. | 438/591 |
| 2009/0321810 | A1 * | 12/2009 | Ryu et al. | 257/321 |

* cited by examiner

*Primary Examiner* — Kyoung Lee
*Assistant Examiner* — Ratisha Mehta
(74) *Attorney, Agent, or Firm* — Slater & Matsil, L.L.P.

(57) ABSTRACT

A system and method for manufacturing a memory device is provided. A preferred embodiment comprises manufacturing a flash memory device with a tunneling layer. The tunneling layer is formed by introducing a bonding agent into the dielectric material to bond with and reduce the number of dangling bonds that would otherwise be present. Further embodiments include initiating the formation of the tunneling layer without the bonding agent and then introducing a bonding agent containing precursor and also include a reduced concentration region formed in the tunneling layer adjacent to a substrate.

20 Claims, 5 Drawing Sheets

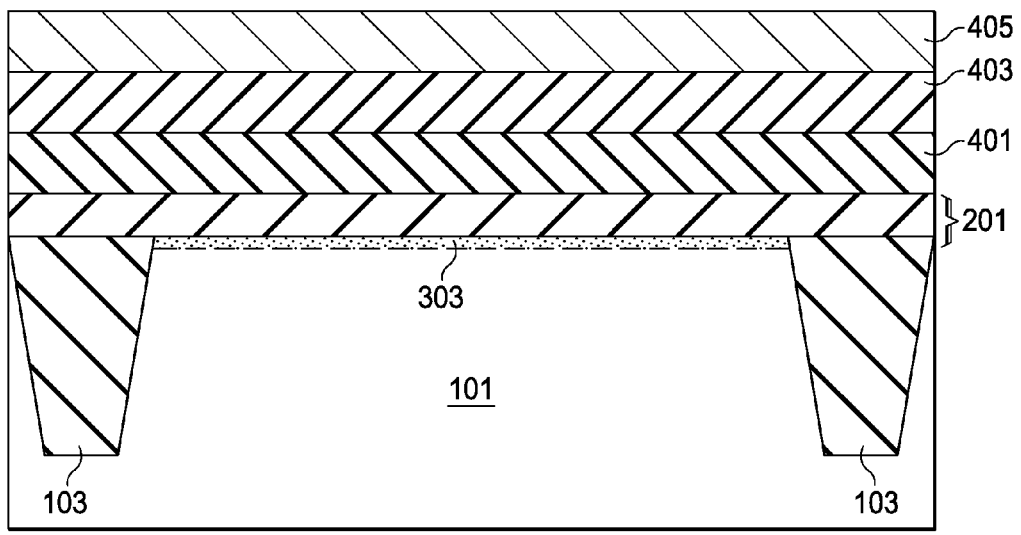
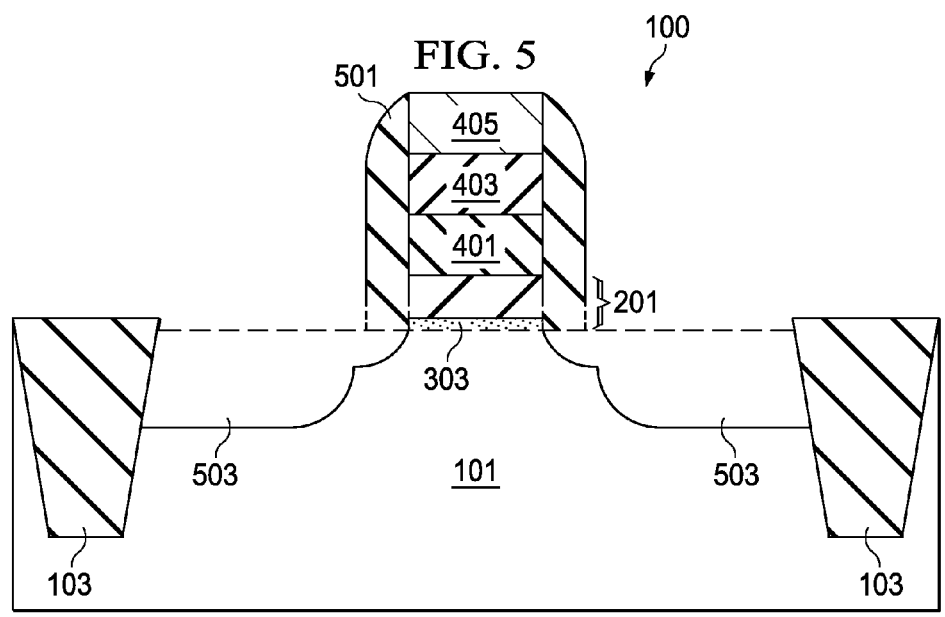

MEMORY DEVICE STRUCTURE AND METHOD

This application claims the benefit of U.S. Provisional Application No. 61/604,438, filed on Feb. 28, 2012, entitled "Memory Device Structure and Method," which application is hereby incorporated herein by reference.

BACKGROUND

Flash memory has become increasingly popular in recent years. A typical flash memory comprises a memory array having a large number of flash memory cells arranged in rows, columns, and blocks. One of the most commonly known flash memories is the one-transistor flash memory, wherein individual ones of the memory cells are fabricated as a field-effect transistor having two gates: a control gate and a floating gate. The floating gate is capable of holding charges and is separated from source and drain regions contained in a substrate by a layer of thin oxide (tunneling oxide).

Each of the memory cells can be electrically charged by injecting hot electrons from the drain region or tunneling electrons from substrate and source-drain regions through the tunneling oxide layer onto the floating gate. The charges can be removed from the floating gate by tunneling the electrons to the substrate through the tunneling oxide layer during an erase operation. Thus the data in a memory cell is determined by the presence or absence of charges in the floating gate.

However, as devices in general, and flash memory cells in particular, have been scaled down in order to meet ever more demanding requirements, multiple issues may arise with respect to the performance or physical requirements of the flash memory cells. Poor or reduced cycling and data retention capabilities are two major concerns in the tunnel oxide when the tunnel oxide traps more electrons than desired during program erase operations. Such undesirable trapping of electrons makes the overall flash memory device less efficient.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 illustrates a formation of a storage layer, a blocking layer, and a gate electrode layer in accordance with an embodiment;

FIG. 5 illustrates a patterning of the storage layer, the blocking layer, and the gate electrode layer in accordance with an embodiment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

Embodiments will be described with respect to a specific context, namely a flash memory cell. Other embodiments may also be applied, however, to other memory cells and other semiconductor devices.

Figure 1:
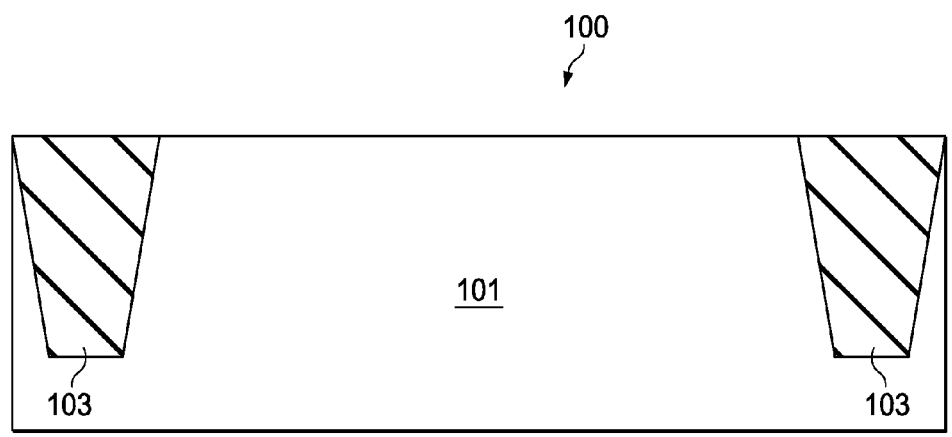
FIG. 1 illustrates a substrate and isolation regions in accordance with an embodiment.

With reference now to FIG. 1, there is shown a simplified cross-sectional view of a memory cell 100 that has a substrate 101 with isolation regions 103 formed therein. The substrate 101 may be a semiconductor material such as silicon, germanium, diamond, or the like, with a crystal orientation of (110). Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used. Additionally, the substrate 101 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 101 may be doped with a p-type dopant, such as boron, aluminum, gallium, or the like, although the substrate may alternatively be doped with an n-type dopant, as is known in the art.

The substrate 101 additionally comprises a plurality of isolation regions 103 designed to separate and isolate various devices formed on the substrate 101. The isolation regions 103 may be shallow trench isolations generally formed by etching the substrate 101 to form a trench and filling the trench with dielectric material as is known in the art. The isolation regions 103 may be filled with a dielectric material such as an oxide material, a high-density plasma (HDP) oxide, or the like, formed by conventional methods known in the art. Optionally, an oxide liner may be formed along the sidewalls isolation regions 103.

Figure 2A:
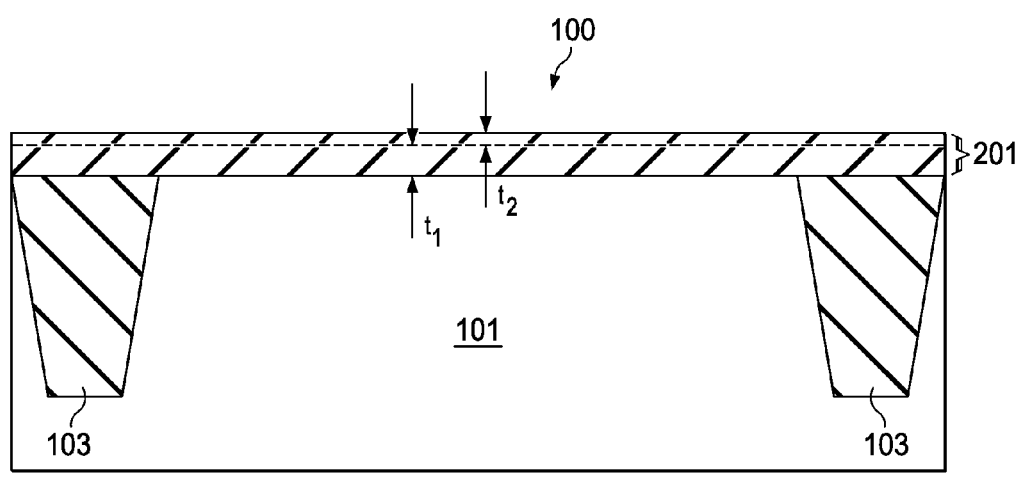
FIGS. 2A-2B illustrate a formation of a tunneling layer in accordance with an embodiment.

FIG. 2 illustrates the formation of a tunneling layer 201 over the substrate 101 and the isolation regions 103. In an embodiment, the tunneling layer 201 may comprise an oxide, such as silicon oxide. In other embodiments, the tunneling layer 201 may comprise a high-k dielectric material, such as HfAlO, $HfO_2$, $Ta_2O_5$, $ZrO_2$, and the like. An advantageous feature for using a high-k dielectric material is that the barrier height between the high-k dielectric material and the underlying substrate 101 is typically low. As is known in the art, there are two typical tunneling mechanisms, Fowler-Nordheim (FN) tunneling and direct tunneling. FN tunneling is typically associated with the barrier height, while direct tunneling is often associated with the thickness of the tunneling layer 201. With the low barrier height, the FN tunneling of charges through the tunneling layer 201 is relatively easy, and the write/erase voltages can be reduced. The barrier height may be less than about 3.1 eV. The thickness of the tunneling layer 201, however, may be increased, so that the direct tunneling, and thus the possible charge-leakage, is reduced.

In an embodiment the tunneling layer 201 may be formed from a dielectric material such as silicon oxide, and may be initially started by using a process such as furnace, rapid thermal oxide (RTO), chemical vapor deposition (CVD), low pressure chemical vapor deposition (LPCVD), plasma enhanced chemical vapor deposition (PECVD), high-density plasma chemical vapor deposition (HDPCVD), combinations of these, or the like. However, any suitable deposition process may alternatively be utilized.

The CVD process may begin by introducing precursors into a deposition chamber that also contains the substrate 101. In an embodiment in which the tunneling layer 201 is silicon oxide, the precursors may comprise silicon containing precursors such as such as tetraethylorthosilicate (TEOS), silane ($SiH_4$), tri-methyl silane (3MS), tetra-methyl-silane (4MS), hydrocarbon silane, methyl diethyl silane (m-deos) and may also comprise oxygenating precursors such as $O_2$, $O_3$, combinations of these, or the like. The silicon containing precursor may be introduced to the deposition chamber at a flow rate of between about 5 sccm and 4000 thousand sccm, such as about 900 sccm (for black diamond (HBD)) and 2300 sccm (for extremely low K dielectrics (ELK)), while the oxygen containing precursor may be introduced to the deposition chamber at a flow rate of between about 5 sccm and 4000 thousand sccm, such as about 600 sccm (HBD) and 2100 sccm (ELK). While the precursors are being introduced, the deposition chamber may be held at a pressure of between about 2 torr and about 450 torr, such as about 3.5 torr (HBD)/7.5 torr (ELK), and at a temperature of between about 25° C. and about 480° C., such as about 335° C. (HBD) or 260° C. (ELK).

By introducing the precursors at these process parameters, the precursors will react and begin to grow the tunneling layer 201 over the substrate 101 and the isolation regions 103. The precursors such as the silicon containing precursor and the oxygenating precursor may be flowed into the deposition chamber and the tunneling layer 201 may be grown for a time period of between about 0.3 s and about 200 s, such as about 43 s (HBD) or 36 s (ELK). As such, the deposition process may continue until the tunneling layer 201 has an initial first thickness $t_1$ of between about 10 Å and about 200 Å, such as about 70 Å.

However, as one of ordinary skill in the art will recognize, the materials and processes described above to form the tunneling layer 201 as silicon oxide is merely one material and process that may be used to form the tunneling layer 201. In other embodiments in which the tunneling layer 201 is a different dielectric material (e.g., HfAlO, $HfO_2$, $Ta_2O_5$, $ZrO_2$), other precursors and other processes may alternatively be utilized. These and any other suitable materials and processes are fully intended to be included within the scope of the embodiments.

Once the tunneling layer 201 has reached the first thickness $t_1$, bonding agents may be introduced into the tunneling layer 201 by continuing the growth of the tunneling layer 201 but additionally introducing a bonding agent containing precursor as an additional precursor. The bonding agent containing precursor is intended to provide a bonding agent that will bond with the silicon located within the tunneling layer 201, thereby helping to reduce dangling bonds within the tunneling layer 201, such as oxide dangling bonds that may otherwise occur without the bonding agent.

In an embodiment the bonding agent may be nitrogen atoms and the bonding agent containing precursor may be a nitrogen containing precursor such as $N_2$, $NO_2$, NO, $N_2O$, $NH_3$, combinations of these, or the like. The bonding agent containing precursor may be introduced into the processing tool (in addition to the other precursors described above) at a flow rate of between about 50 sccm and about 18000 sccm, such as about 5000 sccm. In an embodiment in which the tunneling layer 201 is silicon oxide, the nitrogen within the nitrogen containing precursors will generate silicon-nitrogen bonds that will offset the silicon-oxygen bonds and reduce the occurrence of oxide dangling bonds within the tunneling layer 201. With such a reduction, the tunneling layer 201 will trap fewer electrons during a programming and erase operation, and the device's cycling window and data retention capability may be increased.

The process with the bonding agent containing precursor to form the tunneling layer 201 may be continued until the tunneling layer 201 has an additional second thickness $t_2$ of between about 1 Å and about 200 Å, such as about 30 Å. This would give the overall tunneling layer 201 a thickness of between about 50 Å and about 200 Å, such as about 100 Å. Once the desired thickness has been obtained, the introduction of all of the precursors may be halted, and the processing tool evacuated and purged in order to stop the deposition process. Additionally, the introduction of the bonding agent containing precursor would also introduce the bonding agent into the previously formed tunneling layer, thereby reducing the oxide dangling bonds throughout the tunneling layer 201.

Figure 2B:
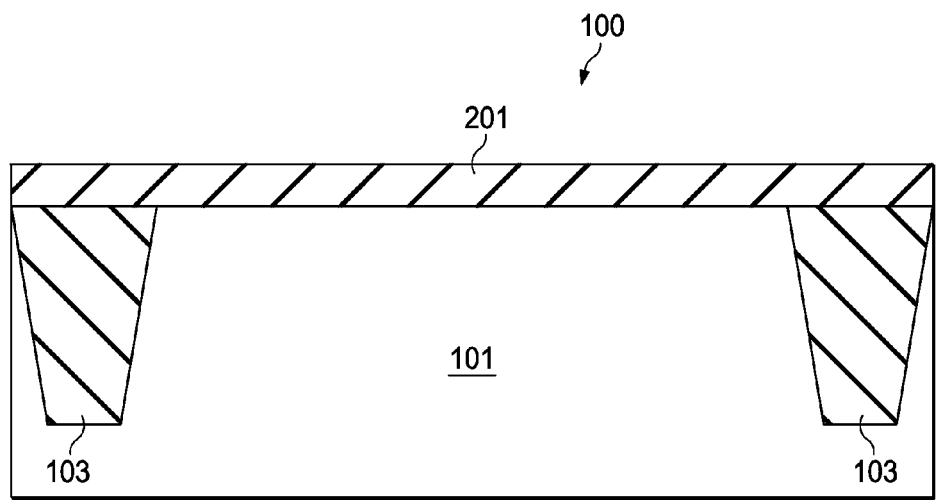

FIG. 2B illustrates an alternative embodiment in which the tunneling layer 201 may be formed in a single process without the change of precursors during the formation. In this embodiment, instead of forming the tunneling layer 201 to the first thickness $t_1$ and then introducing the bonding agent containing precursor as another precursor after the first thickness $t_1$ has been obtained, the bonding agent containing precursor may be introduced at the beginning of the deposition process along with the rest of the precursors. By introducing the bonding agent at the beginning of the deposition process, the tunneling layer 201 has a reduced number of dangling bonds. The tunneling layer 201 in this embodiment may be formed to a thickness of between about 50 Å and about 200 Å, such as about 100 Å.

For example, in an embodiment in which the tunneling layer 201 is silicon oxide and the bonding agent is nitrogen, the silicon containing precursor (e.g., TEOS), the oxygenating precursor (e.g., $O_3$), and the bonding agent containing precursor (e.g., $N_2$), are all introduced simultaneously to the processing tool. Once introduced, the silicon containing precursor and the oxygenating precursor react to form the silicon oxide, while the bonding agent containing precursor provides the bonding agent to reduce the oxide dangling bonds that would form without the presence of the bonding agent. Once the tunneling layer 201 has been formed, the flow of the precursor materials is stopped, and the growth of the tunneling layer 201 is stopped.

Figure 3:
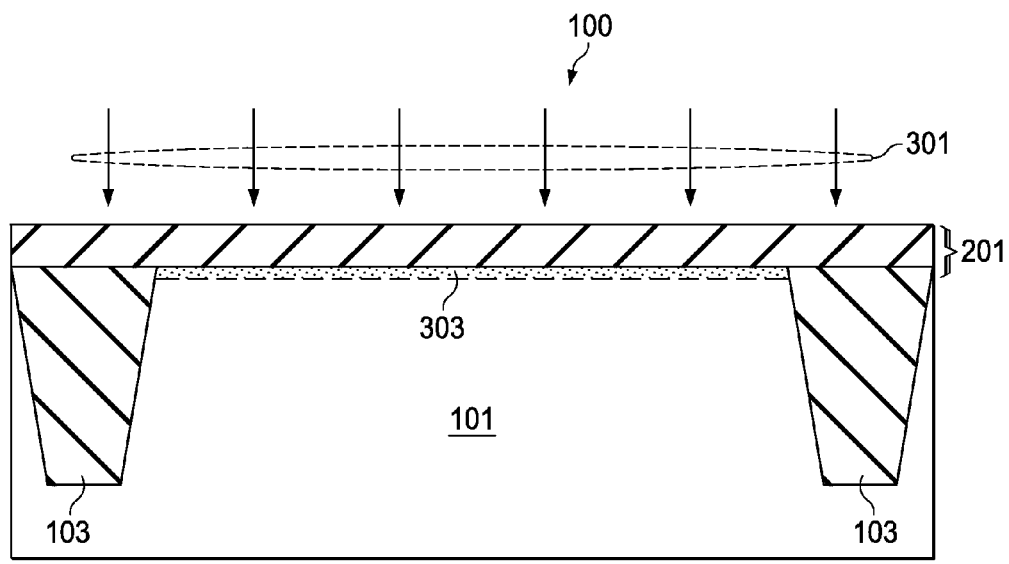
FIG. 3 illustrates a treatment of the tunneling layer in accordance with an embodiment.

FIG. 3 illustrates an optional treatment (represented by lines 301 in FIG. 3) that may be performed on the tunneling layer 201 after the tunneling layer 201 has been formed. The treatment 301 may be used to introduce a reactant such as oxygen into the tunneling layer 201, where it will diffuse through the tunneling layer 201 and towards the interface between the substrate 101 and the tunneling layer 201. In an embodiment in which the substrate 101 comprises silicon, once the reactant has reached the interface of the substrate 101 and the tunneling layer 201, the reactant (e.g., oxygen) will react with the silicon in the substrate 101 to form an reduced bonding agent concentration region 303 from the substrate 101 and to effectively move the interface between the substrate 101 and the tunneling layer 201 away from those portions of the tunneling layer 201 that comprise the bonding agent.

In an embodiment the reduced bonding agent concentration region 303 may be formed using an oxidation process such as rapid thermal oxide (RTO). In this embodiment the substrate 101 and the tunneling layer 201 may be placed into a rapid thermal chamber (not shown) and heated to a temperature between about 800° C. and about 1100° C., such as about 1100° C., while the pressure of the furnace heater is held to between about 10 torr and about 760 torr, such as about 760 torr. In an embodiment in which the reactant is oxygen, the tunneling layer 201 may also be exposed to an oxygen containing ambient environment while the substrate 101 and the tunneling layer 201 are being heated. In an embodiment the oxygen containing ambient environment may comprise oxygen containing molecules such as steam ($H_2O$), ozone ($O_3$), combinations of these, or the like. The tunneling layer 201 may be heated and exposed to the oxygen containing ambient environment for a time period of between about 10 sec and about 60 min such as about 80 sec (RTO) and about 30 min (furnace), in order to form the reduced bonding agent concentration region 303 to have a thickness of between about 10 Å and about 100 Å. By introducing new oxygen atoms into the tunneling layer 201 and forming the reduced bonding agent concentration region 303 from the substrate 101, the interface between the tunneling layer 201 and the substrate 101 will be shifted such that a the reduced bonding agent concentration region 303 is formed between the substrate 101 and the rest of the tunneling layer 201. As such, the tunneling layer 201 may have a lower concentration of the bonding agent nearer the substrate 101 than further away from the substrate 101.

However, as one of ordinary skill in the art will recognize, the rapid thermal oxidation process described above is not the only method that may be utilized to form the reduced bonding agent concentration region 303. Other oxidation processes, such as a furnace, a wet oxidation, an in-situ steam generated (ISSG) oxidation processes, combinations of these, or the like, may alternatively be utilized. These and any other process whereby the concentration of the bonding agent in the interface of the tunneling layer 201 may be reduced may alternatively be utilized, and all such processes are fully intended to be included within the scope of the embodiments.

By providing the bonding agent to the tunneling layer 201 and reducing the number of dangling bonds, the data retention of the memory cell 100 may also be improved. For example, the threshold voltage shift caused from stored electron loss of memory cells 100 formed using the bonding agent as described above may be about 0.7 V. This is an improvement over non-bonding agent processes, which may have the threshold voltage shift about 1.3 V.

FIG. 4 illustrates a formation of a storage layer 401, a blocking layer 403, and a gate electrode layer 405 over the tunneling layer 201. The storage layer 401 may be a poly film or a dielectric layer with a high trap density. In addition, the conduction band of the storage layer 401 may be lower than the conduction band of silicon. In an embodiment, the storage layer 401 comprises aluminum nitride (AlN). AN may be deposited using physical vapor deposition or sputter, for example, sputtering aluminum in an environment comprising nitrogen as a reactive gas. In an embodiment for forming the storage layer 401, the reactive gas includes nitrogen having a flow rate of about 25 sccm and argon having a flow rate of about 5 sccm. In other embodiments, the storage layer 401 may include other high-k dielectric materials including oxides, nitrides and oxynitrides, such as $Si_3N_4$, $Al_2O_3$, $HfO_2$, HfON, ZrON, and combinations thereof. An advantageous feature of using AlN in the storage layer 401 is that its conduction band is lower than the conduction band of $Si_3N_4$, thus the band discontinuity between the storage layer 401 and the subsequently formed gate electrode layer 405 is lowered, resulting in a reduced leakage for charges stored in the storage layer 401.

In other embodiments, the storage layer 401 may further comprise Ga or GaN in addition to AlN, forming AlGaN. An advantageous feature of GaN is its negative band alignment to silicon, meaning that the conduction band of GaN is not only lower than that of $Si_3N_4$, but also lower than that of the substrate 101 (e.g., silicon). A further advantageous feature is that GaN has a high valence band, thus the resulting valence band of AlGaN is increased compared to that of AlN. The low conduction band of AlGaN results in further reduction in the leakage, and the high valence band results in the reduction of over-erase.

AlGaN may be formed using metal organic chemical vapor deposition (MOCVD) at a temperature of about 550° C. The composition of aluminum, gallium and nitride may be adjusted to achieve a desired conduction band and valence band. In an embodiment, the storage layer 401 may comprise between about 1 percent and about 99 percent aluminum, and between about 99 percent and about 1 percent gallium. The thickness of the storage layer 401 may be greater than about 10 Å, such as between about 80 Å and about 100 Å.

The blocking layer 403 may be formed over the storage layer 401, and may have a low leakage of charges. Accordingly, the blocking layer 403 may have a high conduction band, so that the barrier height, which is the difference between the conduction band of the blocking layer 403 and the conduction band of the subsequently formed gate electrode layer 405, may be high, such as greater than about 3.1 eV. In an embodiment, the blocking layer 403 comprises $AlLaO_3$, which may be formed using physical vapor deposition (PVD) of AlLa in a reactive gas comprising oxygen. In other embodiments, the blocking layer 403 may comprise other high-k dielectric materials, such as $HfAlO_3$, $HfO_2$, $Ta_2O_5$, $Al_2O_3$, $ZrO_2$, $TiO_2$, $SrTiO_3$, and combinations thereof. Commonly used methods such as PVD, atomic layer chemical vapor deposition (ALCVD), MOCVD, and the like can also be used. The k value of the blocking layer 403 may be greater than about 3.9, such as greater than about 9. The use of a high-k dielectric material will cause a lower voltage drop in blocking layer 403, and thus the voltage drop in tunneling layer 201 is increased accordingly, making write and erase operations more efficient. As a result, write and erase voltages can be reduced accordingly.

The gate electrode layer 405 may be may be a poly film or a metal-comprising layer having a high work function. A higher work function also helps increase the barrier height, thus reducing the undesirable FN tunneling through the blocking layer 403, which results in leakage and the replenish of charges into the storage layer 401 during the erase operations. In an embodiment, the work function of the gate electrode layer 405 may be greater than about 4.0 eV, such as greater than about 4.5 eV. In an exemplary embodiment, the gate electrode layer 405 may comprise TaN, which has a work function of about 4.7 eV. An exemplary method for depositing a TaN layer includes sputtering or physical vapor deposition (PVD) to deposit tantalum, and the deposition conditions preferably include argon at a flow rate of 25 sccm, nitrogen at a flow rate of 5 sccm, and a DC power of about 450 W. In other embodiments, the gate electrode layer 405 may comprise conductive metal oxides and/or metal oxynitrides. In another embodiment, the gate electrode layer 405 may include $IrO_2$, which has a work function of about 5.1 eV. $IrO_2$ is preferably deposited using sputter or PVD, and the deposition conditions include argon at a flow rate of 25 sccm, nitrogen at a flow rate of 5 sccm, and a DC power of about 450 W. In yet other embodiments, the gate electrode layer 405 may be a substantially pure-metal gate comprising metals such as iridium, platinum, nickel, palladium, rhodium, and combinations thereof. Similarly, the formation methods preferably include sputter and PVD.

FIG. 5 illustrates that, after they have been formed, the tunneling layer 201, the storage layer 401, the blocking layer 403, and the gate electrode layer 405 may be patterned, forming a gate stack. In an embodiment the tunneling layer 201, the storage layer 401, the blocking layer 403, and the gate electrode layer 405 may be patterned using a photolithographic masking and etching process. For example, a photosensitive material may be placed over the gate electrode layer 405, exposed to an energy source such as light, and developed to expose those regions of the gate electrode layer 405 to be removed. Once the photoresist has been formed, one or more etches may be utilized to remove those regions of the tunneling layer 201, the storage layer 401, the blocking layer 403, and the gate electrode layer 405 that were exposed by the photoresist.

FIG. 5 also illustrates the formation of spacers 501 and source/drain regions 503 adjacent to the gate stack. Spacers 501 are formed on the sidewalls of the tunneling layer 201, the storage layer 401, the blocking layer 403, and the gate electrode layer 405. The spacers 501 are typically formed by blanket depositing a spacer layer (not shown) on the previously formed structure. The spacer layer may comprise SiN, oxynitride, SiC, SiON, oxide, and the like, and may be formed by commonly used methods such as chemical vapor deposition (CVD), plasma enhanced CVD, sputter, and other methods known in the art. The spacer layer is then patterned to form the spacers 501, such as by anisotropically etching to remove the spacer layer from the horizontal surfaces of the structure.

Source/drain regions 503 may be formed in the substrate 101 on opposing sides of the tunneling layer 201. In an embodiment in which the substrate 101 is a p-type substrate, the source/drain regions 503 may be formed by implanting appropriate n-type dopants such as phosphorous, arsenic, antimony, or the like. The source/drain regions 503 may be implanted using the tunneling layer 201, the storage layer 401, the blocking layer 403, the gate electrode layer 405, and the spacers 501 as masks to form the source/drain regions 503.

It should be noted that one of ordinary skill in the art will realize that many other processes, steps, or the like may be used to form the source/drain regions 503. For example, one of ordinary skill in the art will realize that a plurality of implants may be performed using various combinations of spacers and liners to form the source/drain regions 503 having a specific shape or characteristic suitable for a particular purpose. Any of these processes may be used to form the source/drain regions 503, and the above description is not meant to limit the embodiments to the steps presented above.

Additionally, other structures may also be formed in addition to the structures specifically described above. For example, silicide regions may be formed on the source/drain regions 503, or an etch stop layer may be formed over the gate stack, the source/drain regions 503, and the isolation regions 103 prior to the formation of a first inter-layer dielectric (ILD) layer 601 (not illustrated in FIG. 5 but illustrated and discussed below with respect to FIG. 6). These structures and any other structures that may aid in the operation of the memory cell may alternatively be utilized, and all such structures are fully intended to be included within the scope of the embodiments.

Figure 6:
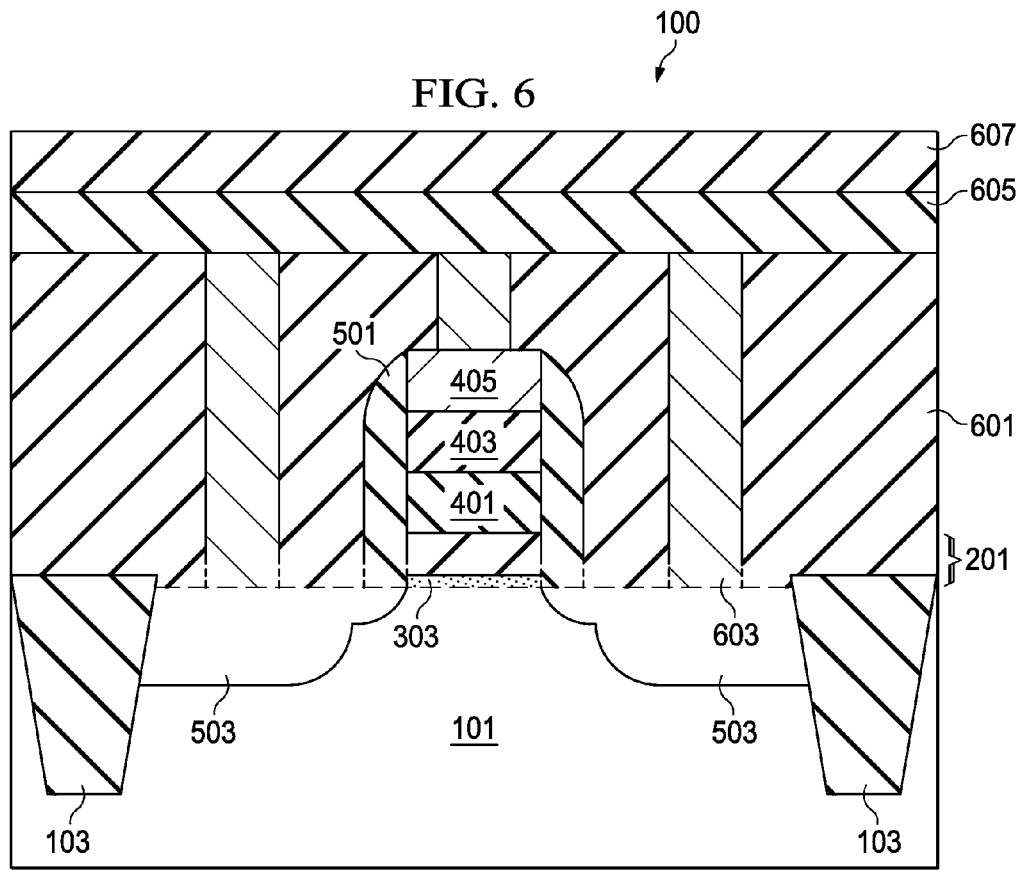
FIG. 6 illustrates a formation of an inter-layer dielectric and contacts in accordance with an embodiment.

FIG. 6 illustrates the formation of the first ILD layer 601 and contacts 603 to the source/drain regions 503 and the gate electrode layer 405. The first ILD layer 601 may comprise a material such as boron phosphorous silicate glass (BPSG), although any suitable dielectrics may be used for either layer. The first ILD layer 601 may be formed using a process such as PECVD, although other processes, such as LPCVD, may alternatively be used. The first ILD layer 601 may be formed to a thickness of between about 100 Å and about 3,000 Å.

The contacts 603 may be formed through the first ILD layer 601 with suitable photolithography and etching techniques. Generally, these photolithography techniques involve depositing a photoresist material, which is masked, exposed, and developed to expose portions of the first ILD layer 601 that are to be removed. The remaining photoresist material protects the underlying material from subsequent processing steps, such as etching. In an embodiment photoresist material is utilized to create a patterned mask to define contacts 603. Additional masks, such as a hardmask, may also be used. The first etching process may be an anisotropic or isotropic etch process.

Contacts 603 may then be formed so as to contact the source/drain regions 503 and the gate electrode layer 405. The contacts 603 may comprise a barrier/adhesion layer (not individually shown in FIG. 6) to prevent diffusion and provide better adhesion for the contacts 603. In an embodiment, the barrier layer is formed of one or more layers of titanium, titanium nitride, tantalum, tantalum nitride, or the like. The barrier layer may be formed through chemical vapor deposition, although other techniques could alternatively be used. The barrier layer may be formed to a combined thickness of about 50 Å to about 500 Å.

The contacts 603 may be formed of any suitable conductive material, such as a highly-conductive, low-resistive metal, elemental metal, transition metal, or the like. In an exemplary embodiment the contacts 603 are formed of tungsten, although other materials, such as copper, could alternatively be utilized. In an embodiment in which the contacts 603 are formed of tungsten, the contacts 603 may be deposited by CVD techniques known in the art, although any method of formation could alternatively be used.

After the contacts 603 are formed, further processing of the substrate 101 may be performed. This processing may comprise forming various conductive and dielectric layers (collectively referred to in FIG. 6 by the reference number 605) in order to form interconnections between the individually formed devices to each other. These interconnections may be made through any suitable formation process (e.g., lithography with etching, damascene, dual damascene, or the like) and may be formed using suitable conductive materials such as aluminum alloys, copper alloys, or the like.

Additionally, once the interconnections have been formed over the first ILD layer 601, a passivation layer 607 may be formed in order to protect the underlying layers from physical and chemical damage. The passivation layer 607 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 607 may be formed through a process such as chemical vapor deposition (CVD), although any suitable process may be utilized.

Figure 7:
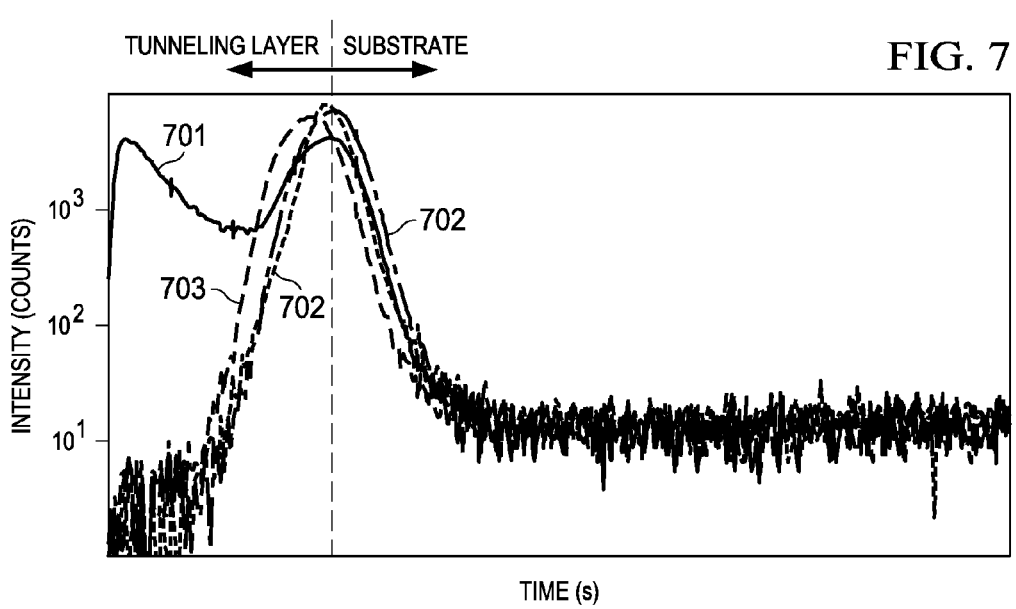
FIG. 7 illustrates test data of improvements that may be achieved in accordance with an embodiment.

FIG. 7 illustrates high resolution SIMS profiles for some of the embodiments described above with respect to FIGS. 1-6. For example, line 701 in FIG. 7 illustrates a nitrogen profile in a tunneling layer 201 formed utilizing ammonia as the bonding agent containing precursor that has been added to the tunneling layer 201 after the tunneling layer 201 has reached the first thickness $t_1$ and then treated with the optional treatment 301. As can be seen, when this bonding agent containing precursor (e.g., ammonia) is utilized with this process, multiple nitrogen peaks may be formed in the tunneling layer 201, and the concentration of the nitrogen gets smaller as it approaches the interface between the substrate 101 and the tunneling layer 201 from the treatment 301.

Alternatively, the multiple lines 702 illustrate two processes utilizing NO gas as the bonding agent containing precursor that has been added to the tunneling layer 201 after the tunneling layer 201 has reached the first thickness $t_1$ but without the optional treatment 301. As can be seen, this process forms a single nitrogen peak within the tunneling layer 201, and the peak is near the interface between the substrate 101 and the tunneling layer 201.

Line 703 illustrates a process utilizing NO gas similar to the process illustrated by lines 702. However, separate from the processes illustrated by lines 702, the process represented by line 703 additionally includes the optional treatment 301. As can be seen, the interface between the substrate 101 and the tunneling layer 201 has been moved because of the treatment 301, causing the concentration of nitrogen in the tunneling layer 201 to have a concentration that is getting smaller from its peak as the concentration gets closer to the interface between the substrate 101 and the tunneling layer 201.

As can be seen in FIG. 7, the distribution of the bonding agent (e.g., nitrogen) may be controlled through the use of the bonding agent containing precursors along with an optional post oxidation step. Different performance parameters may be selected by changing the bonding agent containing precursors or through the addition of a high temperature post oxidation.

Figure 8A:
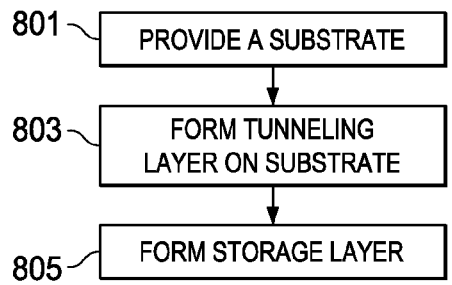
FIGS. 8A-8C illustrate flow charts of embodiments that may be used to form the tunneling layer in accordance with an embodiment.
Figure 8B:
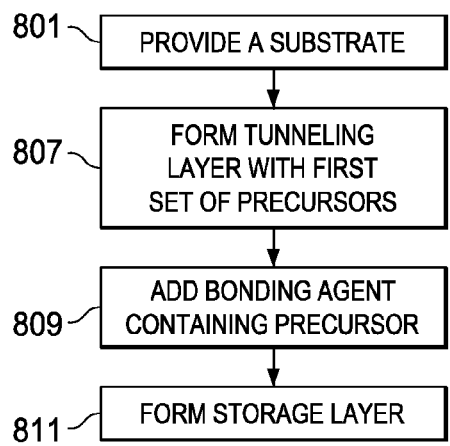
Figure 8C:
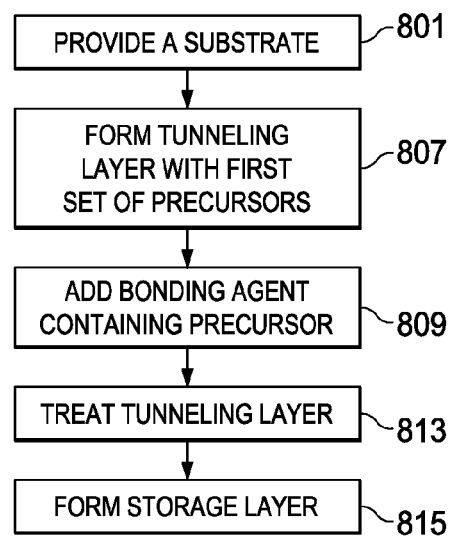

FIGS. 8A-8C illustrate flow charts that may be used in embodiments to form the tunneling layer 201 as described above with respect to FIGS. 2-4. In FIG. 8A, the method may begin at step 801 in providing the substrate 101. In step 803, the tunneling layer 201 is formed utilizing a single set of precursors, with one of the precursors being the bonding agent containing precursor. Finally, in step 805, the storage layer 401 is formed over the tunneling layer 201. In this embodiment the tunneling layer 201 may have nitrogen incorporated into it.

FIG. 8B illustrates steps in another embodiment to form the tunneling layer 201. In this embodiment step 801 is again to provide the substrate 101. However, the formation of the tunneling layer 201 is initially started with a first set of precursors without the bonding agent containing precursor. After a base layer has been grown, the bonding agent containing precursor is additionally added to the other precursors in step 809 and the growth of the tunneling layer 201 is finished. After the tunneling layer 201 has been formed, the storage layer 401 may be formed on the tunneling layer 201 in step 811. In this embodiment the tunneling layer 201 also has nitrogen incorporated into it.

FIG. 8C illustrates steps in yet another embodiment to form the tunneling layer 201. In this embodiment step 801 is again to provide the substrate 101, step 807 is to form the tunneling layer 201 with a first set of precursors (without the bonding agent containing precursor) on the substrate 101, and step 809 is to additionally add the bonding agent containing precursor while continuing the formation of the tunneling layer 201. After the tunneling layer 201 has been formed, the tunneling layer 201 may be treated in step 813. After the tunneling layer 201 has been treated, the storage layer 401 may be formed on the tunneling layer 201 in step 815. In this embodiment the tunneling layer 201 may have reduced nitrogen content at the interface of the tunneling layer 201 and the substrate 101.

In accordance with an embodiment, a method for manufacturing a semiconductor device comprising depositing a tunneling layer on a substrate, the depositing the tunneling layer being performed at least in part by introducing a bonding agent containing precursor during the depositing the tunneling layer, is provided. A storage layer, a blocking layer, and a gate electrode layer are formed over the tunneling layer.

In accordance with another embodiment, a method of manufacturing a semiconductor device comprising depositing a tunneling layer over a substrate is provided. The depositing the tunneling layer comprises introducing a first precursor and a second precursor to a substrate and, after the introducing the first precursor and the second precursor, introducing a third precursor to the substrate in addition to the first precursor and the second precursor, the third precursor comprising a bonding agent. A storage layer, a blocking layer, and a gate electrode layer are deposited over the tunneling layer.

In accordance with yet another embodiment, a method of manufacturing a semiconductor device comprising introducing a first tunneling layer precursor and a second tunneling layer precursor to a substrate to initiate growth of a tunneling layer is provided. A third tunneling layer precursor is introduced to the substrate after the tunneling layer has grown to a first thickness, the third tunneling layer precursor comprising a bonding agent. The introduction of the first tunneling layer precursor, the second tunneling layer precursor, and the third tunneling layer precursor is stopped, and the tunneling layer is treated after the stopping the introduction of the first tunneling layer precursor, the second tunneling layer precursor, and the third tunneling layer precursor, wherein the treating forms a first region of bonding agent concentration and a second region of bonding agent concentration, wherein the first region of bonding agent concentration is closer to the substrate and has a lower concentration of bonding agent than the second region of bonding agent concentration.

Although the present embodiments and their advantages have been described in detail, it should be understood that various changes, substitutions and alterations can be made herein without departing from the spirit and scope of the embodiments as defined by the appended claims. For example, the thicknesses of the various layers or the types of oxidations within the treatment may be varied while still remaining within the scope of the embodiments. These devices, steps and materials may be varied while remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method for manufacturing a semiconductor device, the method comprising:
   depositing a tunneling layer on a substrate, the depositing the tunneling layer being performed at least in part by introducing a bonding agent containing precursor after a portion of the tunneling layer has been formed to join a first precursor for the tunneling layer during the depositing the tunneling layer; and forming a storage layer, a blocking layer, and a gate electrode layer over the tunneling layer, wherein at least a portion of the forming the storage layer occurs prior to any patterning of the tunneling layer comprising the bonding agent.

2. The method of claim 1, wherein the depositing the tunneling layer further is performed at least in part by initially introducing precursors without the bonding agent containing precursor.

3. The method of claim 2, further comprising forming an reduced bonding agent concentration region in the tunneling layer adjacent to the substrate.

4. The method of claim 1, further comprising forming an reduced bonding agent concentration region in the tunneling layer adjacent to the substrate.

5. The method of claim 4, wherein the forming the reduced bonding agent concentration region comprises re-oxidizing the tunneling layer.

6. The method of claim 5, wherein the re-oxidizing the tunneling layer is performed at least in part with a furnace oxidation.

7. The method of claim 1, wherein the bonding agent containing precursor is a nitrogen containing precursor.

8. The method of claim 7, wherein the nitrogen containing precursor comprises $N_2$, $NO_2$, $NO$, $N_2O$, or $NH_3$.

9. A method of manufacturing a semiconductor device, the method comprising:
depositing a tunneling layer over a substrate, the depositing the tunneling layer comprising:
introducing a first precursor and a second precursor to a substrate;
after the introducing the first precursor and the second precursor, introducing a third precursor to the substrate in addition to the first precursor and the second precursor such that the first precursor, the second precursor, and the third precursor are being introduced to the substrate simultaneously, the third precursor comprising a bonding agent; and
depositing a storage layer, a blocking layer, and a gate electrode layer over the tunneling layer comprising the bonding agent; and
patterning the tunneling layer after the depositing the storage layer.

10. The method of claim 9, further comprising forming a region of reduced bonding agent concentration adjacent to the substrate prior to the depositing the storage layer, the blocking layer, and the gate electrode layer.

11. The method of claim 10, wherein the forming the region of reduced bonding agent concentration further comprises oxidizing the tunneling layer.

12. The method of claim 11, wherein the oxidizing the tunneling layer further comprises placing the tunneling layer in an oxygen containing ambient within a furnace.

13. The method of claim 9, wherein the tunneling layer is silicon oxide and the bonding agent is nitrogen.

14. The method of claim 9, wherein the third precursor comprises $N_2$, $NO_2$, $NO$, $N_2O$, or $NH_3$.

15. A method of manufacturing a semiconductor device, the method comprising:
introducing a first tunneling layer precursor and a second tunneling layer precursor to a substrate to initiate growth of a tunneling layer;
introducing a third tunneling layer precursor to the substrate after the tunneling layer has grown to a first thickness, wherein the introducing the third tunneling layer occurs while the introducing the first tunneling layer precursor and the second tunneling layer precursor continues, the third tunneling layer precursor comprising a bonding agent;
stopping the introduction of the first tunneling layer precursor, the second tunneling layer precursor, and the third tunneling layer precursor;
treating the tunneling layer after the stopping the introduction of the first tunneling layer precursor, the second tunneling layer precursor, and the third tunneling layer precursor, wherein the treating forms a first region of bonding agent concentration and a second region of bonding agent concentration, wherein the first region of bonding agent concentration is closer to the substrate and has a lower concentration of bonding agent than the second region of bonding agent concentration;
depositing a storage layer; and
patterning the tunneling layer after a patterning of the storage layer.

16. The method of claim 15, wherein the first tunneling layer precursor is a precursor of silicon oxide.

17. The method of claim 15, wherein the bonding agent is nitrogen.

18. The method of claim 15, wherein the treating the tunneling layer comprises oxidizing a portion of the tunneling layer.

19. The method of claim 18, wherein the oxidizing the portion of the tunneling layer further comprises placing the tunneling layer into a furnace with an oxygen containing ambient.

20. The method of claim 15, wherein the third tunneling layer precursor comprises $N_2$, $NO_2$, $NO$, $N_2O$, or $NH_3$.

* * * * *